US012598712B2

(12) United States Patent
Shigematsu

(10) Patent No.: US 12,598,712 B2
(45) Date of Patent: Apr. 7, 2026

(54) ELECTRONIC APPARATUS HAVING LIQUID-PROOF STRUCTURE

(71) Applicant: CANON KABUSHIKI KAISHA, Tokyo (JP)

(72) Inventor: Masayasu Shigematsu, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 139 days.

(21) Appl. No.: 18/599,823

(22) Filed: Mar. 8, 2024

(65) Prior Publication Data

US 2024/0365482 A1 Oct. 31, 2024

(30) Foreign Application Priority Data

Apr. 26, 2023 (JP) ................................ 2023-072067

(51) Int. Cl.
*H05K 5/02* (2006.01)
(52) U.S. Cl.
CPC ................................. *H05K 5/0217* (2013.01)
(58) Field of Classification Search
USPC ........................................ 361/807, 809, 810
See application file for complete search history.

(56) References Cited

U.S. PATENT DOCUMENTS

2015/0029314 A1* 1/2015 Reichow .............. H04N 13/388
348/51

FOREIGN PATENT DOCUMENTS

| | | | |
|---|---|---|---|
| JP | S53164139 U | 12/1978 | |
| JP | 09067456 A | 3/1997 | |
| JP | H01155269 A | 2/1999 | |
| JP | 2002240325 A | 8/2002 | |
| JP | 2011039385 A * | 2/2011 | .............. G02B 7/08 |
| JP | 2012033428 A | 2/2012 | |
| JP | 2022166448 A | 11/2022 | |

OTHER PUBLICATIONS

The above foreign patent document was cited in an Aug. 12, 2025 Japanese Office Action, which is enclosed with an English Translation, that issued in Japanese Patent Application No. 2023-072067. The above foreign patent documents were cited in the Mar. 25, 2025 Japanese Office Action, which is enclosed without an English Translation, that issued in Japanese Patent Application No. 2023-072067.

* cited by examiner

*Primary Examiner* — Hung S. Bui
(74) *Attorney, Agent, or Firm* — Cowan, Liebowitz & Latman, P.C.

(57) ABSTRACT

An electronic apparatus includes a first member having a first surface, and a second member having a second surface that faces the first surface of the first member via a gap. A fine structure having a liquid-repellent effect is formed on at least one of the first surface and the second surface. The second surface has a tilt relative to the first surface, which narrows the gap toward an opening where liquid can enter.

6 Claims, 3 Drawing Sheets

ELECTRONIC APPARATUS HAVING LIQUID-PROOF STRUCTURE

BACKGROUND

Technical Field

One of the aspects of the embodiments relates to an electronic apparatus having a liquid-proof structure.

Description of Related Art

Some electronic apparatuses carried by users require high liquid-proof performance. In particular, an electronic apparatus having a component such as an operation member connected to an exterior member is to secure liquid-proof performance in a gap between the exterior member and the operation member while suppressing the increase in size.

Japanese Patent Laid-Open No. 9-67456 discloses a liquid-proof structure that includes a liquid-repellent coating formed on each opposing surface in a gap that is formed by arranging the opposing surfaces of two or more members so that they face each other. Japanese Patent Laid-Open No. 2022-166448 discloses a liquid-proof structure that has a liquid-repellent fine structure on opposing surfaces of two exterior members that face each other.

The liquid-proof structure disclosed in Japanese Patent Laid-Open No. 9-67456 is to form the liquid-repellent coating on each opposing surface, and thus causes the number of manufacturing steps to increase.

In the liquid-proof structure disclosed in Japanese Patent Laid-Open No. 2022-166448, the fine structure provided on each opposing surface of the exterior member is fragile against external force and easily deforms. In a case where the fine structure deforms, the liquid-proof performance may deteriorate.

SUMMARY

An electronic apparatus according to one aspect of the disclosure includes a first member having a first surface, and a second member having a second surface that faces the first surface of the first member via a gap. A fine structure having a liquid-repellent effect is formed on at least one of the first surface and the second surface. The second surface has a tilt relative to the first surface, which narrows the gap toward an opening where liquid can enter.

Further features of various embodiments of the disclosure will become apparent from the following description of embodiments with reference to the attached drawings.

DESCRIPTION OF THE EMBODIMENTS

Referring now to the accompanying drawings, a detailed description will be given of embodiments according to the disclosure.

Figure 1:
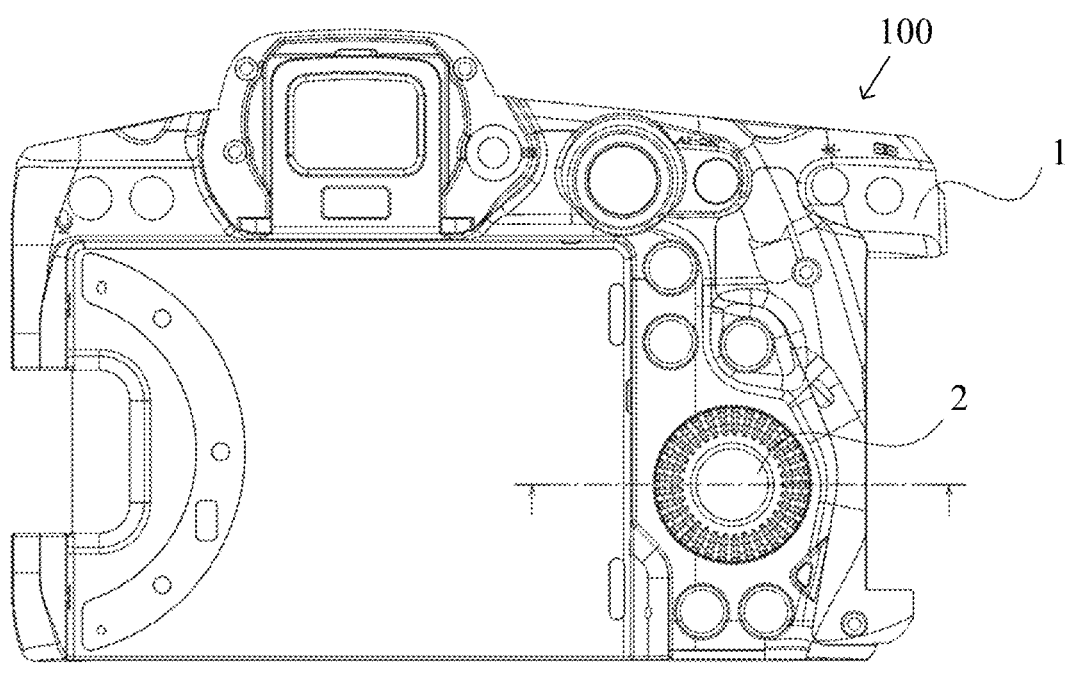
FIG. 1 is a front view of an image pickup apparatus according to this embodiment.

FIG. 1 illustrates an image pickup apparatus 100 as an electronic apparatus according to this embodiment, viewed from the back side (the side opposite to the object side). The image pickup apparatus 100 includes an unillustrated lens unit on the object side, houses an unillustrated image sensor, such as a CMOS sensor, and generates image data from an imaging signal obtained by photoelectrically converting an object image formed by the lens unit by the image sensor.

The image pickup apparatus 100 has an exterior cover (first member) 1 as an exterior member (housing). A dial 2 as an operation member is provided on the back side of the exterior cover 1, along with a monitor for displaying image data. Rotating the dial 2, the user can set an imaging mode and another setting relating to imaging.

Figure 2:
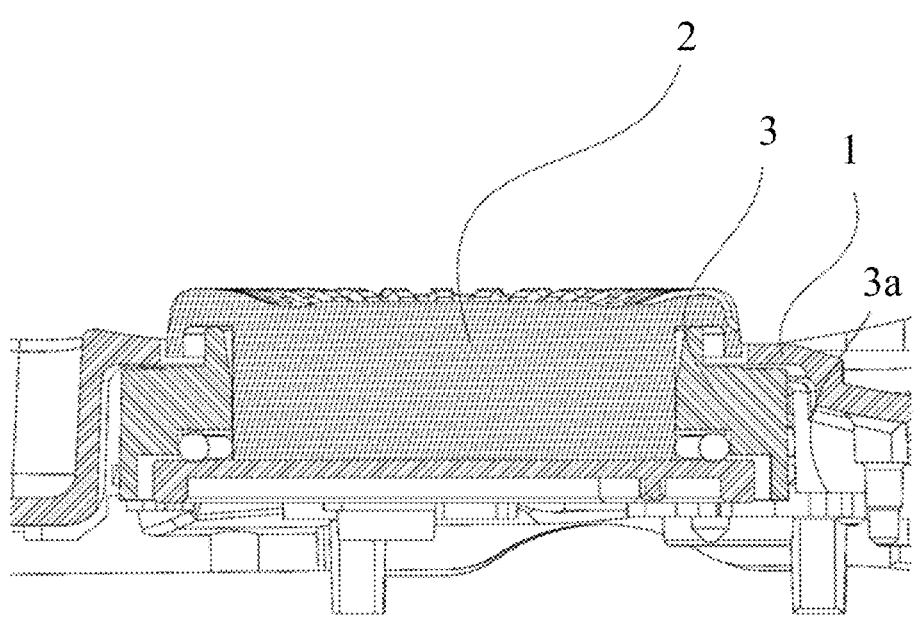
FIG. 2 is a sectional view of an operation member according to this embodiment.

FIG. 2 illustrates a section of the dial 2 in the image pickup apparatus 100 taken along a plane passing through the center of the dial 2 indicated by an alternate long and short dash line in FIG. 1. A holder (second member) 3 that rotatably holds the dial 2 is connected to the exterior cover 1 at its connector 3a, and is fixed by an unillustrated screw.

Figure 3:
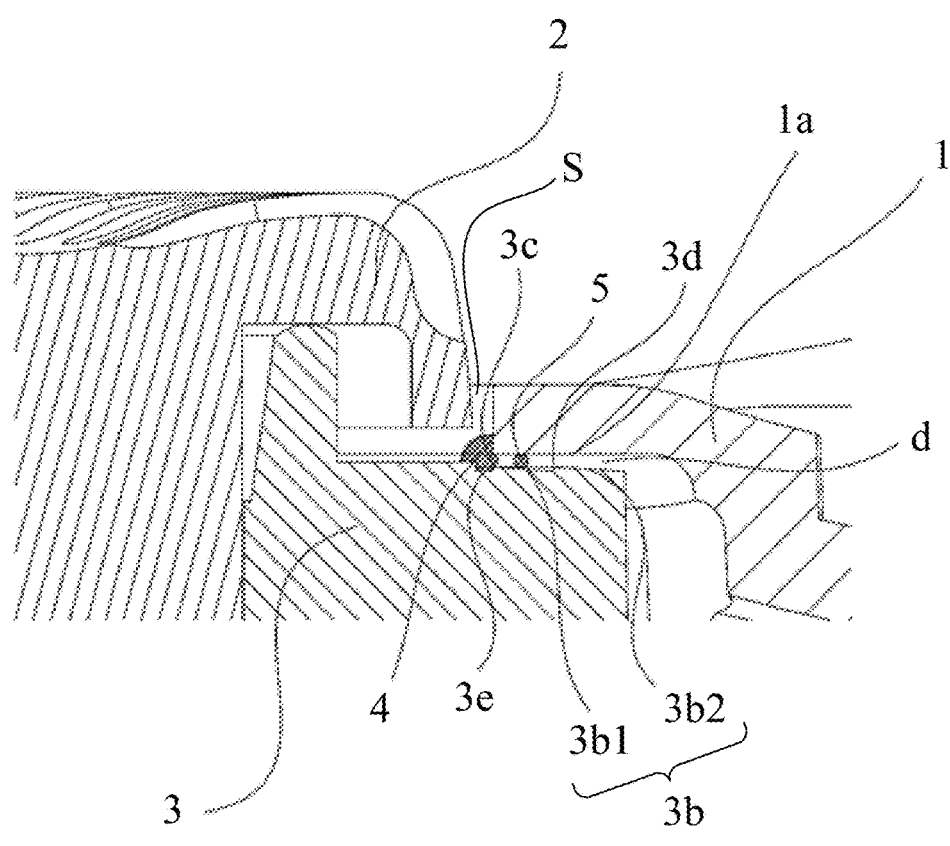
FIG. 3 is a sectional view of an opposing part according to this embodiment.
Figure 4:
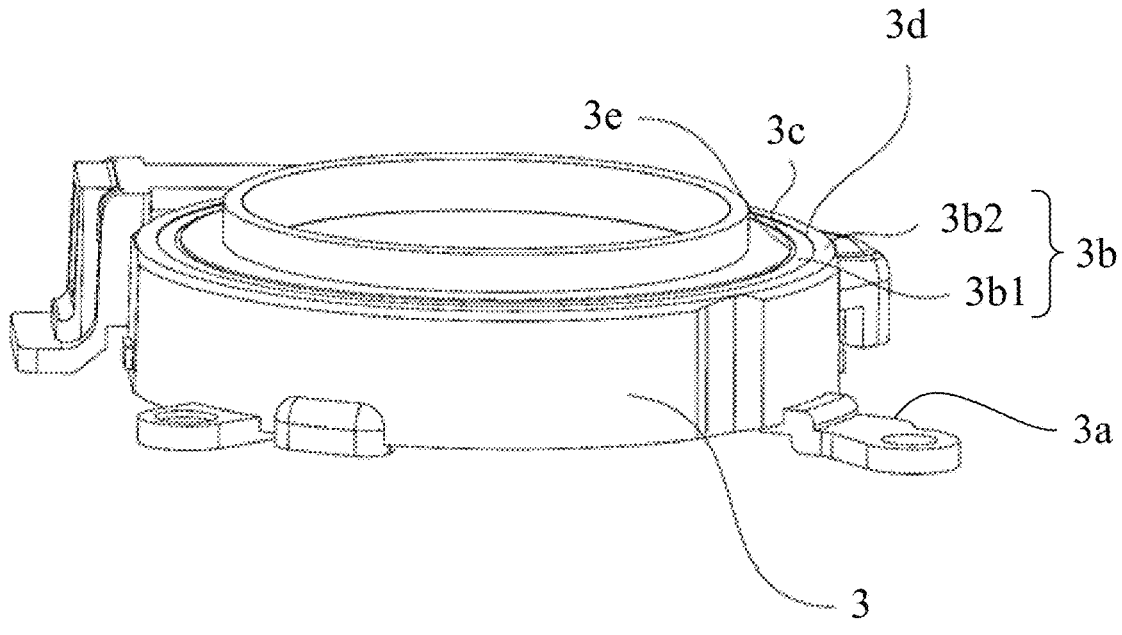
FIG. 4 is a perspective view of a holder according to this embodiment.

FIG. 3 is a partially enlarged view of the dial 2 and holder 3 illustrated in FIG. 2. FIG. 4 illustrates the appearance of the holder 3.

If the exterior cover 1 and the holder 3 are brought into contact at a portion other than the connector 3a illustrated in FIG. 2, the positional accuracy in the vertical direction (in which the central axis of the dial 2 extends) in FIGS. 2 to 4 deteriorates. Thus, this embodiment adopts a configuration in which the exterior cover 1 and the holder 3 are not brought into contact with each other except at the connector 3a. As a result, as illustrated in FIG. 3, a gap d is created in the portion where they face each other. As illustrated in FIG. 4, an opposing surface 3b of the holder 3 has a ring shape extending in a circumferential direction of the holder 3. Similarly, an opposing surface 1a of the exterior cover 1 also has a ring shape.

As illustrated in FIG. 3, a gap (exterior space) s between the outer circumference of the dial 2 and the exterior cover 1 is connected to the gap d. FIG. 3 illustrates a water droplet 4 as a liquid just before entering the gap d through the exterior space s, and a water droplet 5 that has entered the gap d.

Figure 5:
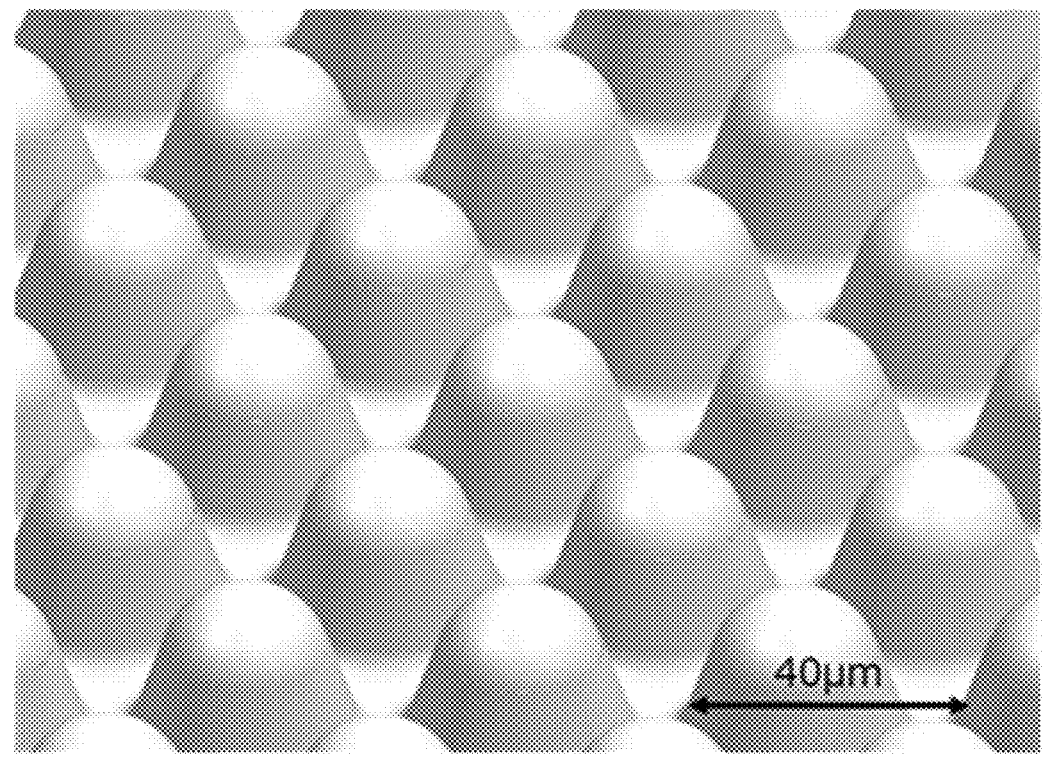
FIG. 5 is an enlarged view of a resin surface having a fine structure according to this embodiment.

FIG. 5 illustrates a fine shape (fine structure or microstructure) of the surface of the resin component. This resin component has a surface in which an inverted uneven (undulation) shape is transferred from a mold in which the fine uneven (undulation) shape is formed by irradiation with a femtosecond laser. In the uneven shape, the pitch of the periodically arranged protrusions is about 40 micrometers. On the surface of a resin component on which such a fine structure is formed, a contact angle of a droplet is larger than a contact angle of a droplet on the surface where no fine structure is formed (such as 90° or more), and thus the liquid-repellent effect such as the water-repellent effect can be obtained. The fine structure illustrated in FIG. 5 is merely illustrative, and another shape may be used as long as the fine structure can provide a liquid-repellent effect.

The liquid-repellent treatment (water-repellent treatment) due to the fine structure may be applied to at least one of the opposing surfaces 1a and 3b. Since the contact angle of the droplet on the surface that has undergone the liquid-repellent treatment is larger than the contact angle of the droplet on the surface that has undergone no liquid-repellent treatment, a force acts on the water droplet 5 toward the outside of the opposing components, and the water droplets 5 can be prevented from penetrating into the interior of the exterior cover 1 from the surface that has undergone the liquid-repellent treatment. The width (breadth) of the gap d may be from 0.05 mm to 0.4 mm, and the narrower the gap d is, the higher the liquid-repellent effect becomes.

A description will now be given of a case in which the exterior cover 1 is made of a metal material such as aluminum or titanium, and the holder 3 is made by molding a resin material using a mold. A fine shape for liquid-repellent treatment to the holder 3 is previously formed on the mold, and the fine shape is transferred from the mold when the holder 3 is molded. Thus, the holder 3 may be made of a resin material (such as polycarbonate) to which the fine shape of the mold is easily transferred. Thereby, the gap between the opposing surfaces 1a and 3b of the exterior cover 1 and the holder 3 may not be filled with a sealing member or the like. Since the fine shape is transferred from the mold, liquid-repellent treatment can be performed at a lower cost than methods such as secondarily applying a liquid-repellent coating to the resin component.

In a case where the exterior cover 1 and the holder 3 are both made by resin molding using a mold, only the exterior cover 1 may have the fine structure with the liquid-repellent effect, or both may be provided with the fine structure. Even when the exterior cover 1 and the holder 3 are made of metal materials, a fine structure having a liquid-repellent effect may be provided by irradiation with a femtosecond laser.

The fine structure formed on the resin component is fragile to external forces and easily deforms. In a case where the opposing surfaces 1a and 3b come into contact with each other when an external force is applied to the exterior cover 1, the fine structure on the opposing surface 3b may be deformed and the liquid-repellent ability may deteriorate. Thus, in this embodiment, as illustrated in FIGS. 3 and 4, the opposing surface 3b includes a slight tilt so as not to be parallel to the opposing surface 1a. The tilt of the opposing surface 3b is such that the gap d between the opposing surfaces 3b and 1a narrows toward the outside of the exterior cover 1 (the opening side where water droplets 4 can enter the gap d, in other words, the exterior space s side). The outside of the exterior cover 1 corresponds to the inside in the radial direction of the holder 3.

More specifically, the opposing surface 3b includes, in order from the outside of the exterior cover 1, a first tilted portion 3b1 having the tilt and a second tilted portion 3b2 having the tilt. A wall portion 3d that rises from the first tilted portion 3b1 is formed between the first tilted portion 3b1 and the second tilted portion 3b2, and the second tilted portion 3b2 starts from the vertex of the wall portion 3d. In other words, the opposing surface 1a has two tilted portions. The number of tilted portions may be three or more stages. Each tilt is set such that the width of the gap d between the opposing surfaces 1a and 3b is from 0.05 mm to 0.4 mm as described above.

Due to this configuration, even if an external force acts on the exterior cover 1 and the opposing surfaces 1a and 3b approach each other, an outermost vertex (that is, an opening side vertex) 3c of the first tilted portion 3b1 and the vertex of the wall portion 3d on the opposing surface 3b contact the opposing surface 1a. Therefore, deformation of the fine structure of at least one of the opposing surfaces 1a and 3b can be minimized.

Since each tilted portion is tilted so that the gap d becomes narrower toward the outside of the exterior cover 1, the water droplet 5 that has entered the gap d receives a force directed toward the outside of the exterior cover 1 due to the capillary action. Thereby, the water droplets 5 is restrained from moving toward the outside of the exterior cover 1, or further moving to the inside of the exterior cover 1. In this way, even if a water droplet 5 enters the gap d from the outside of the exterior cover 1, it is unlikely to move to the inside of the exterior cover 1.

As described above, two tilted portions, even if a water droplet 5 enters the first tilted portion 3b1 of the outer step, the second tilted portion 3b2 of the inner step restrains the water droplet 5 from moving forward. Thus, intrusion of water droplets can be suppressed more effectively than the case of the single tilted portion.

A surface 3e extending in a ring shape in the circumferential direction in a portion outside the opposing surface 3b (opening of the gap d) of the holder 3 has a fine structure with a lyophilic effect having a fine shape adjusted so that the contact angle is less than 90°. More specifically, the contact angle can be adjusted by adjusting the fine shape and pitch as illustrated in FIG. 5, and the fine shape and pitch are adjusted so that the contact angle of the droplet is less than 90°. Thereby, the fine structure having the hydrophilic effect can be obtained. Due to this lyophilic treatment, a force that pulls the water droplet 4 outward is applied just before the gap d, and the effect of suppressing the water droplet 4 from entering the gap d can be enhanced.

This embodiment can secure high liquid-proof performance at the opposing portions of the exterior cover 1 and the holder 3 connected to the exterior cover 1, while saving space and at a low cost. Even if the opposing surface on which the fine structure is formed and the opposing surface that opposes it come into contact with each other due to the external force, the contact occurs only in the minimum portion, and the deterioration of the liquid-repellent ability can be minimized. Further, even if water or other liquid enters the gap between the opposing portions, the liquid can be discharged to the outside due to the capillary action, and further intrusion of the liquid into the inside can be suppressed.

Although the liquid-proof structure provided in the image pickup apparatus 100 has been described in this embodiment, the liquid-proof structure described in this embodiment can be adopted in various electronic apparatuses other than the image pickup apparatus.

While the disclosure has described example embodiments, it is to be understood that some embodiments are not limited to the disclosed embodiments. The scope of the following claims is to be accorded the broadest interpretation so as to encompass all such modifications and equivalent structures and functions.

Each embodiment can provide an electronic apparatus having a liquid-proof structure that has high liquid-proof performance and is less likely to be deformed in its fine structure even when an external force is applied.

This application claims priority to Japanese Patent Application No. 2023-072067, which was filed on Apr. 26, 2023, and which is hereby incorporated by reference herein in its entirety.

What is claimed is:

1. An electronic apparatus comprising:
   a first member as an exterior member having a first surface; and
   a second member disposed inside the first member and having a second surface that faces the first surface of the first member via a gap,
   wherein a fine structure having a liquid-repellent effect is formed on at least one of the first surface and the second surface,
   wherein the second surface has a tilt relative to the first surface, which narrows the gap toward an opening where liquid can enter, and wherein the second surface includes, in order from an opening side, a first tilted portion having the tilt, a wall portion rising from the first tiled portion, and a second tilted portion having the tilt, and wherein, when the first member receives an external force and thereby approaches the second surface, the second surface contacts the first member at an opening side vertex of the first tilted portion and a vertex apex of the wall portion.

2. The electronic apparatus according to claim 1, wherein the tilt is set such that the gap has a width between 0.05 mm and 0.4 mm.

3. The electronic apparatus according to claim 1, wherein the tilt causes a capillary action to occur in the liquid that has entered the gap.

4. The electronic apparatus according to claim 1, wherein the first member is made of a metal material, and the second member is made of a resin material, and wherein the second surface includes the fine structure and the tilt.

5. The electronic apparatus according to claim 1, wherein a portion of the second member outside the opening of the gap has a fine structure with a hydrophilic effect.

6. The electronic apparatus according to claim 1, wherein the second member is a holder configured to hold an operation member operable by a user, and wherein the opening is connected to space between the operation member and the exterior member.

\* \* \* \* \*